United States Patent
Mukhopadhyay et al.

(10) Patent No.: US 7,403,075 B2
(45) Date of Patent: Jul. 22, 2008

(54) ULTRA WIDE BAND SIGNAL GENERATOR

(75) Inventors: Rajarshi Mukhopadhyay, Atlanta, GA (US); Sebastien Nuttinck, Atlanta, GA (US); Yun-Seo Park, Atlanta, GA (US); Sang-Woong Yoon, Atlanta, GA (US); Sang-Hyun Woo, Seoul (KR); Hyun-Il Kang, Yongin-si (KR); Chang-Ho Lee, Marietta, GA (US); Joy Laskar, Marietta, GA (US)

(73) Assignees: Samsung Electronics Co., Ltd (KR); Georgia Tech Research Corporation, Atlanta, GA (US)

( * ) Notice: Subject to any disclaimer, the term of this patent is extended or adjusted under 35 U.S.C. 154(b) by 43 days.

(21) Appl. No.: 11/345,716

(22) Filed: Feb. 2, 2006

(65) Prior Publication Data
US 2006/0197617 A1   Sep. 7, 2006

Related U.S. Application Data

(60) Provisional application No. 60/649,285, filed on Feb. 2, 2005.

(30) Foreign Application Priority Data
May 3, 2005   (KR)   ............ 10-2005-0037291

(51) Int. Cl.
  *H03B 1/00* (2006.01)
(52) U.S. Cl. ............ 331/76; 331/36 L; 331/181
(58) Field of Classification Search ............ 331/76, 331/36 L, 181
See application file for complete search history.

(56) References Cited

U.S. PATENT DOCUMENTS

| 5,347,238 | A | 9/1994 | Kobayashi | |
|---|---|---|---|---|
| 5,821,825 | A | 10/1998 | Kobayashi | |
| 2005/0189999 | A1* | 9/2005 | Cathelin et al. | 331/36 C |

(Continued)

FOREIGN PATENT DOCUMENTS

JP   08065050   3/1996

OTHER PUBLICATIONS

Kobayashi et al., A Novel Self-Oscillating HEMT-HBT Cascode VCO-Mixer Using an Active Tunable Inductor, IEEE Journal of Solid-State Circuits, vol. 33, No. 6, Jun. 1998; pp. 870-875.

(Continued)

*Primary Examiner*—Joseph Chang
(74) *Attorney, Agent, or Firm*—The Farrell Law Firm, PC

(57) ABSTRACT

Disclosed is an ultra wide band signal generator. The ultra wide band signal generator generates a signal of a required frequency using a harmonic signal having a frequency range of a ultra wide band (UWB). The ultra wide band signal generator includes an active inductor for generating harmonic signals having power strengths substantially equal to each other within a non-linear operation range, the tunable active inductor capable of tuning a value thereof, an oscillator for amplifying and outputting the harmonic signals generated from the active inductor by frequency-transiting the harmonic signals into high frequency bands, and a filter for selectively outputting one of the harmonic signals output from the oscillator.

12 Claims, 10 Drawing Sheets

U.S. PATENT DOCUMENTS

2006/0055470 A1* 3/2006 Luong et al. ............... 331/36 L
2006/0103479 A1* 5/2006 Paillet et al. .................. 331/57
2006/0158267 A1* 7/2006 McCorquodale et al. ...... 331/34

OTHER PUBLICATIONS

Wu et al., A Constant Power Consumption CMOS LC Oscillator Using Improved High-Q Active Inductor With Wide Tuning-Range, The 47th IEEE International Symposium on Circuits and Systems, vol. 3, Jul. 25-28, 2004, pp. III347-III350.

Cho et al., A Novel Active Inductor and Its Application to Inductance-Controlled Oscillator, IEEE Transactions on Microwave Theory and Techniques, vol. 45, No. 8, Aug. 1997; pp. 1208-1213.

* cited by examiner

ULTRA WIDE BAND SIGNAL GENERATOR

PRIORITY

This application claims priority to applications entitled "Ultra Wide Band Signal Generator" filed in United States Patent and Trademark Office on Feb. 2, 2005 and assigned U.S. provisional application Ser. No. 60/649,285 and filed in the Korean Intellectual Property Office on May 3, 2005 and assigned Serial No. 2005-37291, the contents of which are incorporated herein by reference.

BACKGROUND OF THE INVENTION

1. Field of the Invention

The present invention relates to a signal generator, and more particularly to a signal generator for generating a signal at a required frequency using a harmonic signal having a frequency range in the ultra wide band (UWB).

2. Description of the Related Art

In a wireless communication system, a radio frequency (RF) signal received in a receiver is converted into an intermediate frequency (IF) signal by means of a mixer 10 as shown in FIG. 1. The mixer 10 mixes a signal delivered from a voltage controlled oscillator (VCO) 12 with the RF signal and converts the frequency of the mixed signal into the frequency of the IF signal.

As described above, the VCO included in the receiver is mainly used for channel selection. In order to be used for band selection, the VCO must have a wider frequency control range.

However, the conventional VCO shown in FIG. 2 cannot control a wide frequency range using only a varactor because a great number of parasitic capacitors exist in the VCO.

As shown in FIG. 3, a non-linear element generates harmonics with respect to a fundamental frequency f, and these harmonics are generated in a wide frequency band. Since these harmonics have very little power, the harmonics are unsuitable for oscillator signals.

SUMMARY OF THE INVENTION

Accordingly, the present invention has been made to solve at least the above-mentioned problems occurring in the prior art, and an object of the present invention is to provide a signal generator for generating harmonic signals in a frequency range of an ultra wide band and outputting a harmonic signal having a desired frequency using a harmonic signal at a power level high enough to be used as an oscillator signal.

Another object of the present invention is to provide a signal generator for generating harmonic signals at a power level high enough to be used as oscillator signals, using a tunable active inductor (TAI) and outputting a harmonic component having a desired frequency using a filter.

To accomplish the above objects, there is provided an ultra wide band signal generator including an active inductor for generating harmonic signals having power strengths similar to each other within a non-linear operating range, the tunable active inductor capable of tuning to a value thereof, an oscillator for amplifying and outputting the harmonic signals generated from the active inductor by frequency-transiting the harmonic signals into high frequency bands, and a filter for selectively outputting one of the harmonic signals output from the oscillator.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENT

Figure 1:
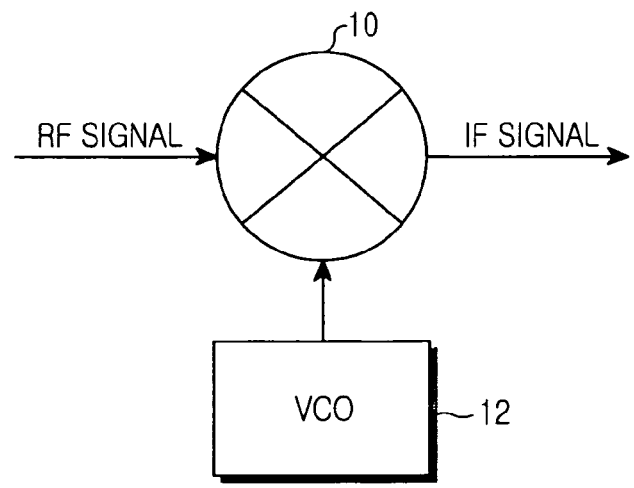
FIG. 1 illustrates an internal structure of a receiver in the conventional wireless communication system.
Figure 2:
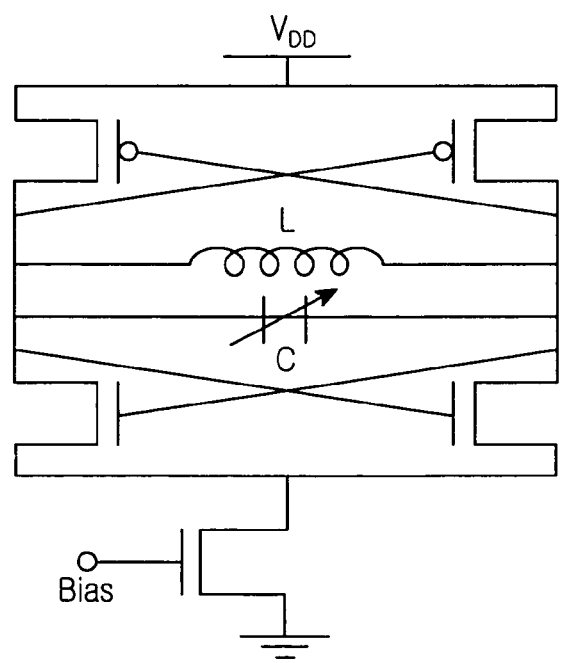
FIG. 2 illustrates the conventional VCO circuit diagram.
Figure 3:
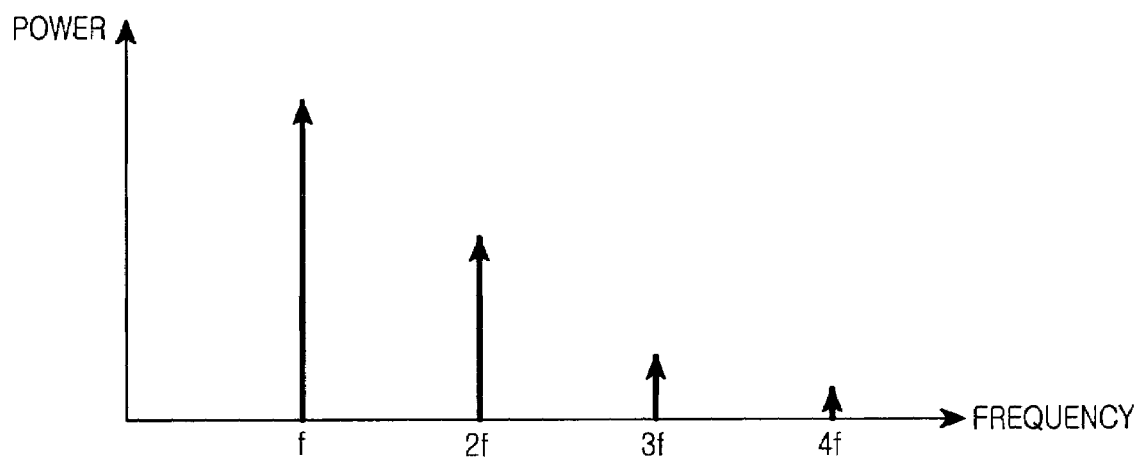
FIG. 3 is a graph illustrating power of general harmonics.

Hereinafter, preferred embodiments of the present invention will be described in detail with reference to the accompanying drawings. Note that the same or similar components in drawings are designated by the same reference numerals as far as possible although they are shown in different drawings. In the following description of the present invention, a detailed description of known functions and configurations incorporated herein will be omitted when it may make the subject matter of the present invention unclear.

An ultra wide band signal generator according to the present invention includes a tunable active inductor (TAI) for generating harmonic signals having an ultra wide band, an oscillator 42 for generating harmonic signals by using non-linear elements, and a filter module 41 for selecting and outputting a signal having a corresponding frequency from among the harmonic signals having the ultra wide band output from the oscillator 42.

The TAI can tune an inductor value thereof and is connected to a base of a transistor Q1 of the oscillator 42 through a capacitor C3.

The oscillator 42 includes the transistor Q1, a bias voltage Bias is input to the base of the transistor Q1 through a resistor R1, and capacitors C1 and C2 are interposed between ground and the base of the transistor of Q1. A current source $I_{core}$ is connected to an emitter of the transistor Q1, and with capacitors C1 and C2. In addition, an Inductor $L_{load}$ connected to a voltage source VDD and a capacitor C4 connected to an output port OUT are linked with a collector of the transistor Q1. The oscillator 42 having the above structure can output the harmonic signal input thereto from the TAI by shifting the frequency band of the harmonic signal into the frequency band of the high frequency signal generated from the oscillator 42.

Figure 4:
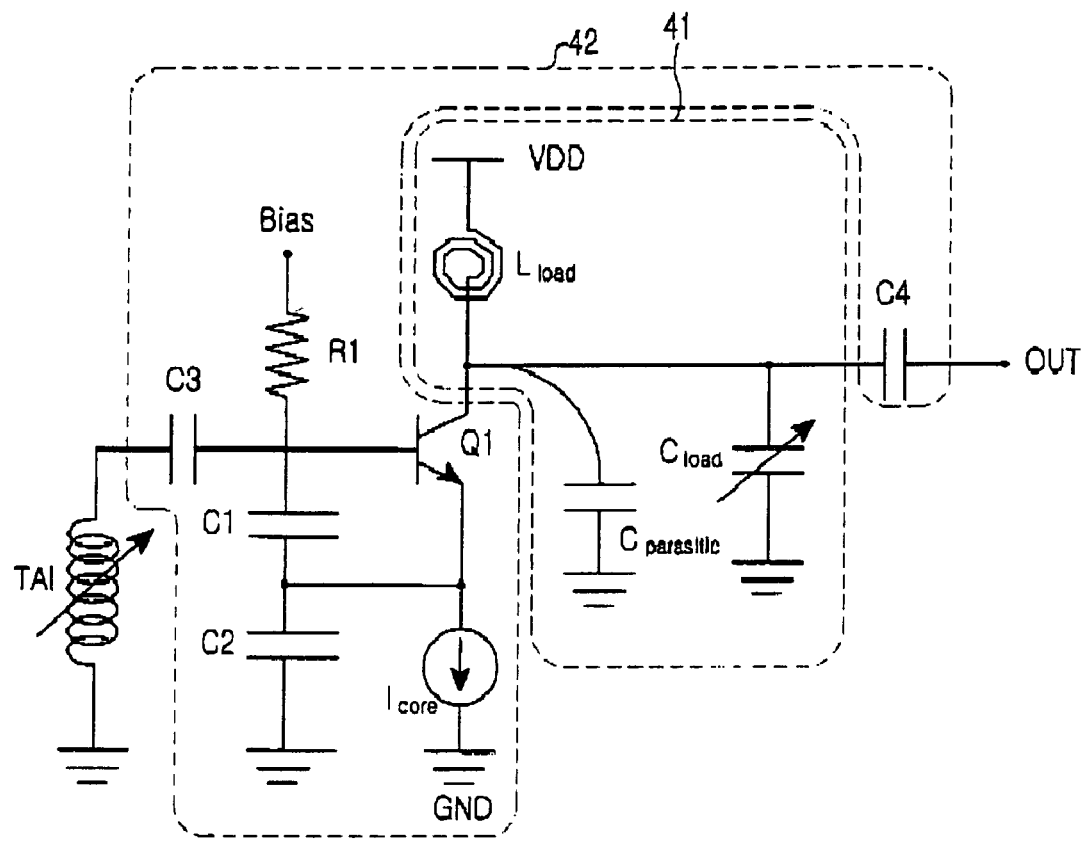
FIG. 4 is a circuit diagram illustrating an ultra wide band signal generator according to a first embodiment of the present invention.
Figure 5:
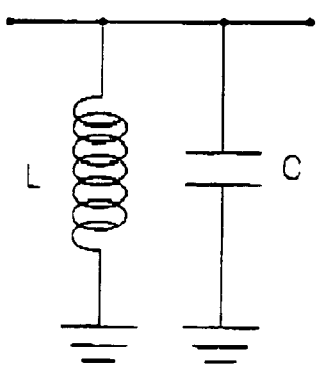
FIG. 5 is a circuit diagram equivalent to a filter module shown in FIG. 4.

The filter module 41 is realized in such a manner that a variable capacitor $C_{load}$ such as a varactor is interposed between the collector of the transistor Q1 and ground so as to select together with the inductor $L_{load}$ a signal having a corresponding frequency from among harmonic signals output from the collector of the transistor Q1. The filter module 41 includes a parasitic capacitor $C_{parasitic}$ as shown in FIG. 4. This allows the filter module 41 to be equivalent to a filter including an inductor L and a capacitor C shown in FIG. 5.

Hereinafter, description about the TAI will be given in more detail.

The TAI generates harmonic signals within a non-linear operation range. Conventionally, since harmonic signals generated from the TAI actually have power of very little strength, it is impossible for the harmonic signals to be used in an oscillator. The present invention increases the strength of the power input to the TAI in order to generate harmonic signals having power which can be used for the oscillator 42. If the strength of a voltage input to the TAI is increased, the strength of power of generated harmonic signals is increased. In addition, when the power of an input voltage is strong, the power of harmonic signals has strength approximate to each other.

Figure 6:
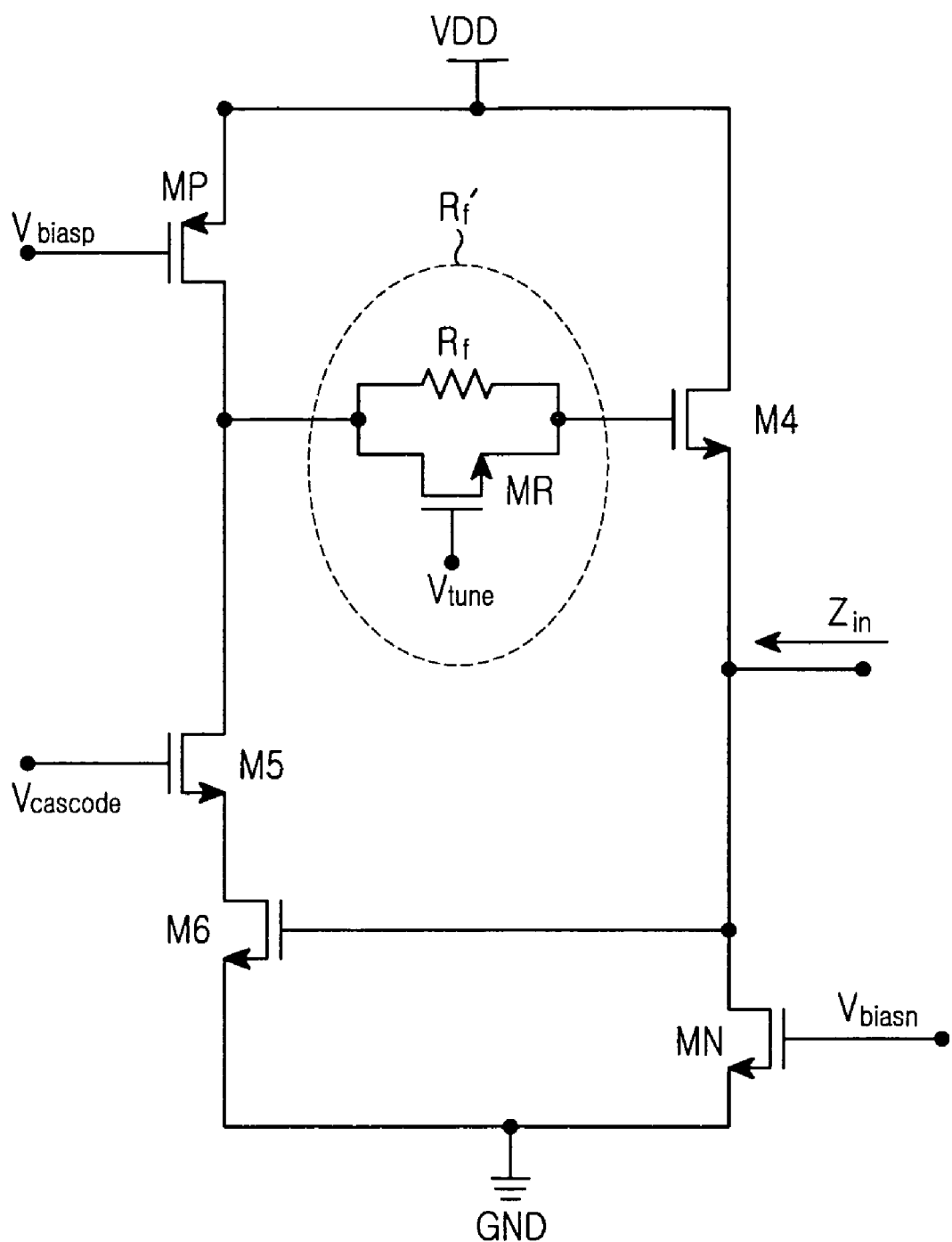
FIG. 6 is a circuit diagram illustrating an example of a TAI shown in FIG. 4.

FIG. 6 is a circuit diagram illustrating an example of the TAI.

The TAI shown in FIG. 6 includes a tunable feedback resistor in a Cascode-Grounded structure. That is, in a Gyrator structure constructed by a transistor M4 and a transistor M6, the TAI has a transistor M5 connected to a transistor M6 in a Cascode-Grounded structure and a tunable feedback resistor $R_f'$ interposed between a drain of the transistor M5 and a gate of a transistor M4. A transistor MP operates as a current source in a PMOS type, and a transistor MN operates as a current source in an NMOS type. The tunable feedback resistor $R_f'$ includes a resistor $R_f$ and the transistor MR.

Herein, on the assumption that the value of the $R_f'$ is obtained through Equation 1, a factor Q, a peak frequency $f_Q$ of the factor Q, and a self-resonance frequency $\omega$ are obtained through Equations 2 to 4, respectively.

$$R_f' \approx \frac{R_f}{1 + R_f g_{dsR}} \quad (1)$$

Herein, the $g_{dsR}$ denotes an output conductance for the transistor MR.

$$Q \approx \frac{\omega \left[C_{gs5}(g_{ds5}+g_{dsP})+C_{gs4}g_{mN}(1+2R_f'g_{dsP})-\omega^2 C_{gs4}^2 C_{gs5} R_f'\{1+R_f'(g_{ds5}+g_{dsP})\}\right]}{[g_{mN}g_{dsP}+g_{ds6}(g_{ds5}+g_{dsP})-\omega^2 C_{gs4}\{C_{gs5}(1+2R_f'(g_{ds5}+g_{dsP}))+C_{gs4}(1+2R_f'g_{dsP})\}]} \quad (2)$$

Herein, the $g_{ds5}$, the $g_{ds6}$, and the $g_{dsP}$ denote output conductances for the transistors of M5, M6, and MP, respectively, and the $C_{gs4}$ and the $C_{gs5}$ denote capacitances between the gates and the sources of the transistors M4 and M5, respectively. The $g_{mM}$ denotes a mutual conductance of the transistor MN, and the $\omega$ denotes a self-resonance frequency.

$$f_Q \approx \frac{1}{2\pi}\sqrt{\frac{g_{mN}g_{dsP}+g_{ds6}(g_{ds5}+g_{dsP})}{C_{gs4}\{C_{gs4}(1+(R_f'g_{dsP})+C_{gs5}(1+2R_f'(g_{ds5}+g_{dsP}))\}}} \quad (3)$$

$$\omega \approx \sqrt{\frac{C_{gs5}(g_{ds5}+g_{dsP})+C_{gs4}g_{mN}(1+2R_f'g_{dsP})}{C_{gs4}^2 C_{gs5} R_f'\{1+R_f'(g_{ds5}+g_{dsP})\}}} \quad (4)$$

It can be understood from Equations 2 to 4 that the TAI according to the present invention constantly maintains the factor Q, the peak frequency $f_Q$ of the factor Q, and the self-resonance frequency $\omega$ by tuning the value of the $g_{dsP}$ even when the value of the $R_f'$ increases.

Since the tunable feedback resistor $R_f'$ includes the resistor $R_f$ and the transistor MR, the intensity of the $R_f'$ can be tuned by controlling the voltage $V_{tune}$ connected to the gate of the transistor MR. The value of the $g_{dsP}$ is tuned by controlling the $V_{biasp}$ connected to the gate of the transistor MP.

In other words, the value of the TAI can be tuned through the combination of the $V_{biasp}$, the $V_{tune}$, and the $V_{biasn}$.

Figure 7:
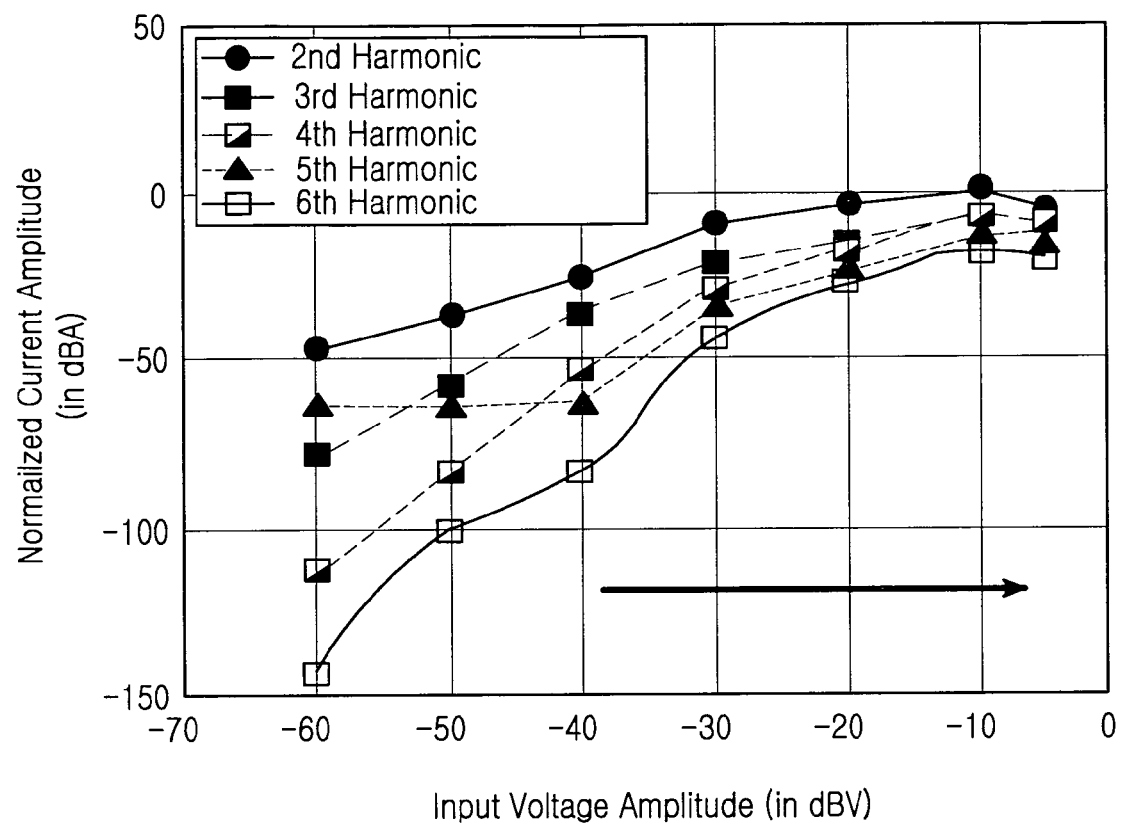
FIG. 7 is a graph illustrating power of harmonics according to an input voltage of a TAI shown in FIG. 4.
Figure 8:
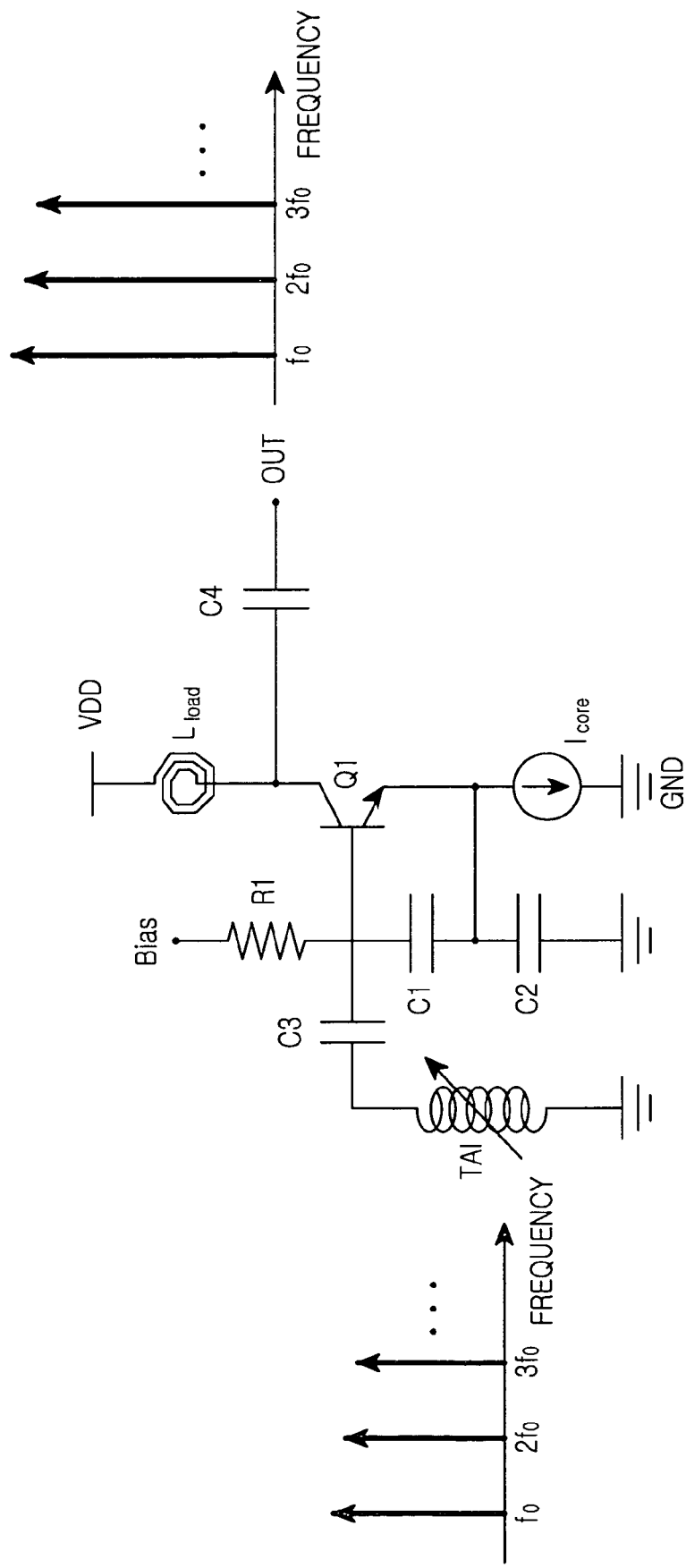
FIG. 8 is a view for explaining harmonics output from an oscillator shown in FIG. 4.

It can be understood that the power of harmonic signals according to an input voltage of the TAI having the above structure may increase and converge into a predetermined value as the input voltage increase as shown in FIG. 7. The present invention uses the above described principle. Accordingly, all harmonic signals having an ultra wide band generated from the oscillator 42 excluding the variable capacitor $C_{load}$ of the filter module 41 shown in FIG. 4 are shown in FIG. 8. In other words, it can be understood from FIG. 8 that harmonic signals having power similar to each other and being generated from the TAI are amplified by the oscillator 42 so that harmonic signals having stronger power are output. As described above, according to the present invention, harmonic signals having an ultra wide band are generated using the TAI.

Figure 9:
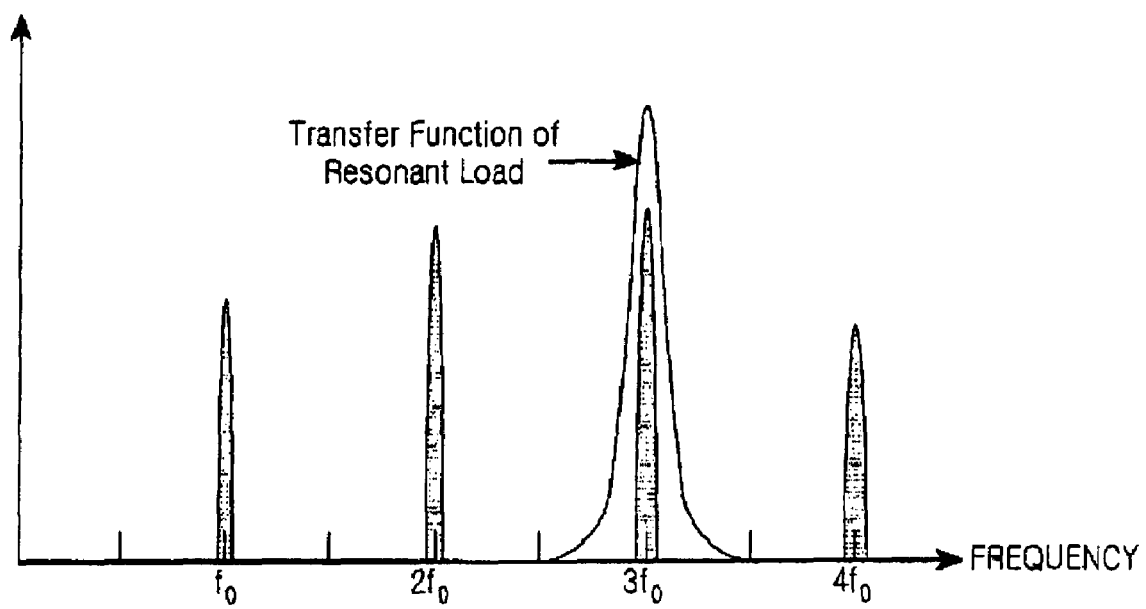
FIG. 9 is a graph illustrating that a harmonic signal having a corresponding frequency is selected by a variable capacitor $C_{load}$ of a filter module shown in FIG. 4.

FIG. 9 is a graph illustrating that the filter module 41 shown in FIG. 4 selects a harmonic signal having a corresponding frequency by using the variable capacitor $C_{load}$. As shown in FIG. 9, it can be understood that the filter module 41 shown in FIG. 4 selects and outputs the harmonic signal having the corresponding frequency from among harmonic signals having an ultra wide band output from the oscillator 42 by means of a transfer function of resonant load of the filter module 41.

Figure 10:
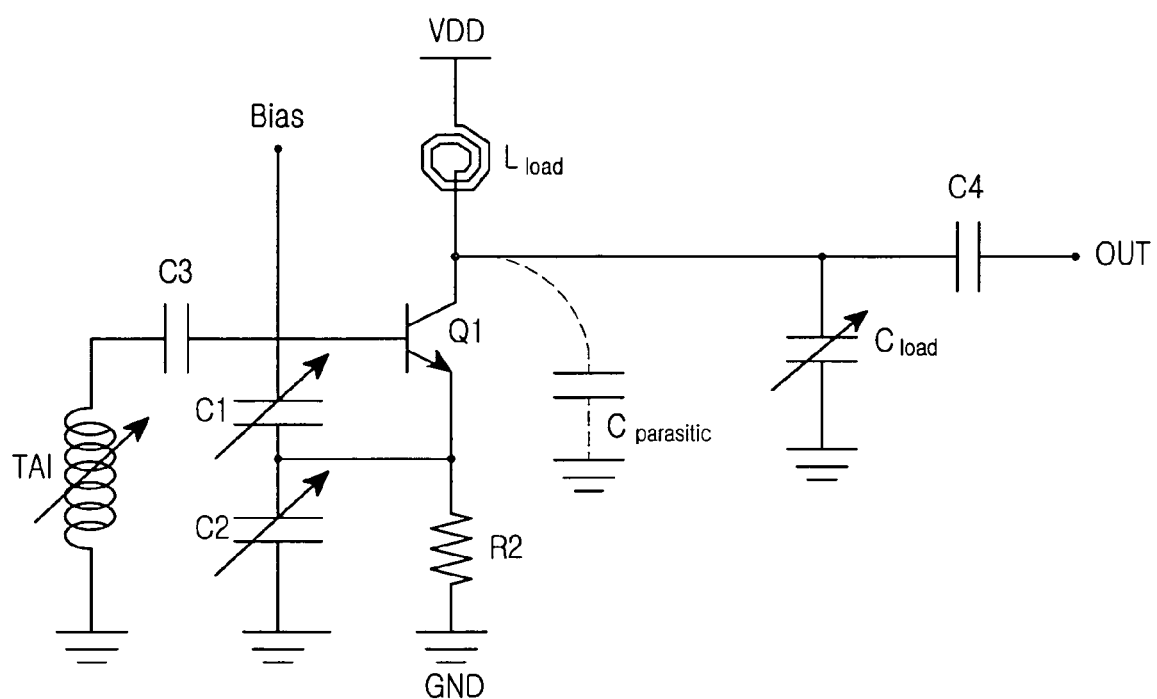
FIG. 10 is a circuit diagram illustrating an ultra wide band signal generator according to the second embodiment of the present invention.

In the meantime, in the signal generator shown in FIG. 4, the resistor R1 connected to the bias voltage Bias is removed, variable capacitors are employed instead of the capacitors C1 and C2, and a resistor R2 is employed instead of the current source $I_{core}$, thereby enabling the realization of a signal generator shown in FIG. 10 according to another embodiment of the present invention.

Figure 11:
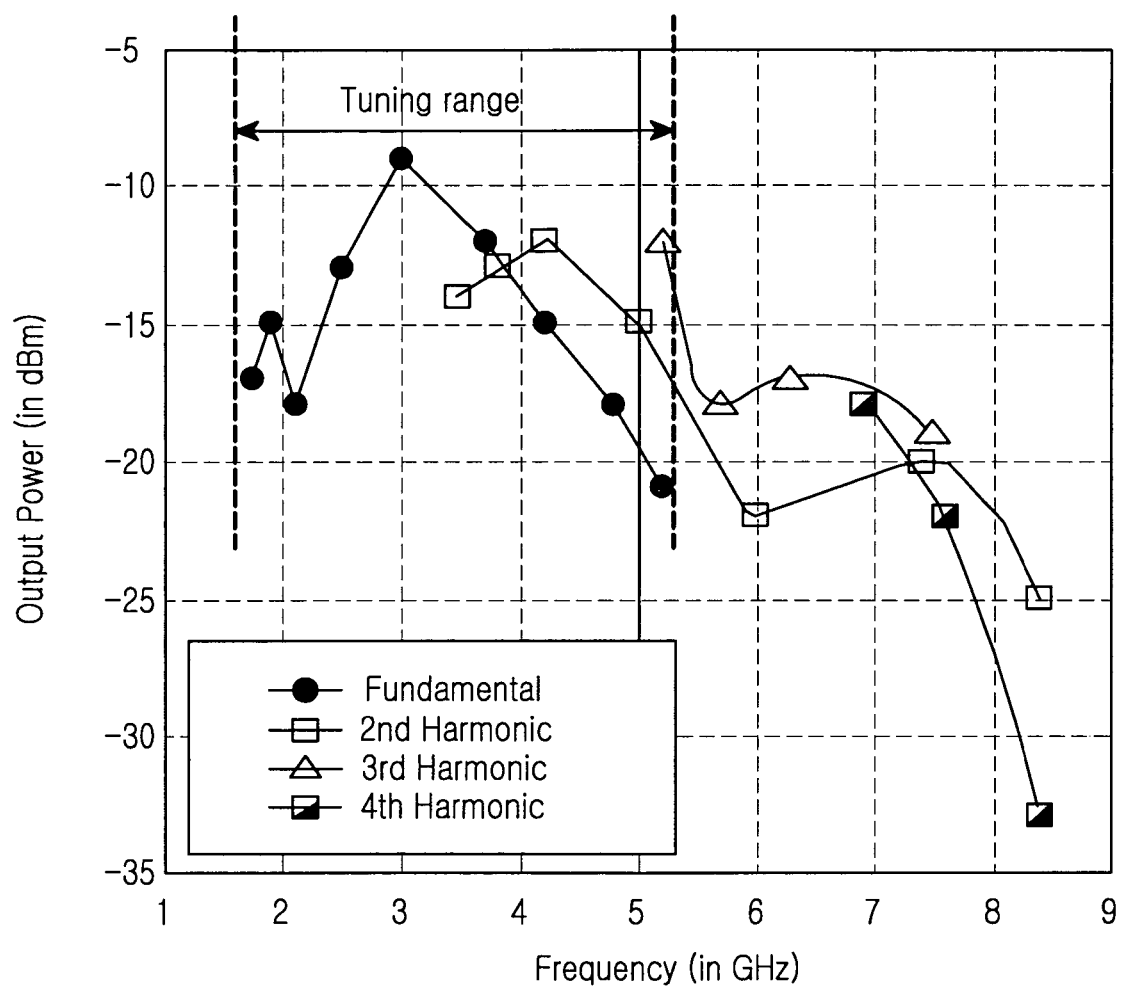
FIG. 11 illustrates output power according to frequencies with respect to a signal generator shown in FIG. 4.
Figure 12:
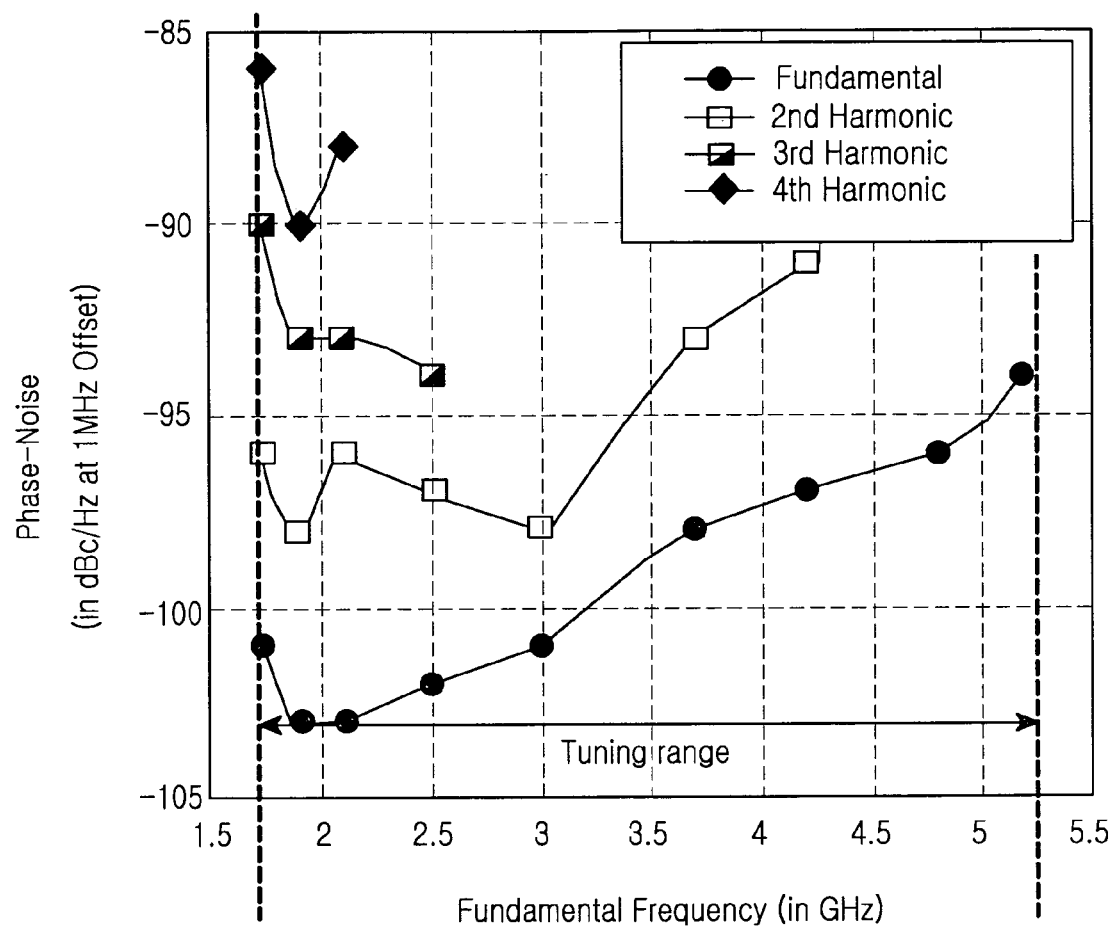
FIG. 12 illustrates a phase noise according to the change of a fundamental frequency with respect to a signal generator shown in FIG. 4.

FIGS. 11 and 12 are graphs illustrating simulation results of the ultra wide band signal generator according to the present invention. FIG. 11 illustrates output power according to frequencies, and FIG. 12 illustrates a phase noise according to the change of a fundamental frequency. FIG. 11 illustrates that the fundamental frequency must be controlled within the range of about 1.7 GHz to 5.2 GHz in order to use the harmonic signals having output power of a fundamental frequency level. FIG. 12 illustrates frequency ranges and phase noises of fundamental frequencies and harmonic signals according to the fundamental frequencies. As shown in FIG. 12, it can be understood that it is more efficient to use a harmonic signal having low intensity instead of a fundamental frequency having strong intensity under the condition of the same phase noise.

As described above, according to the present invention, it is possible to provide a signal generator for generating harmonic signals having an ultra wide band using a tunable active inductor and selecting and outputting a harmonic signal having a corresponding frequency by means of a filter, thereby enabling the control of a frequency of the generated signal within the range of the ultra wide band.

While the invention has been shown and described with reference to certain preferred embodiments thereof, it will be understood by those skilled in the art that various changes in form and details may be made therein without departing from the spirit and scope of the invention. Consequently, the scope of the invention should not be limited to the embodiments, but should be defined by the appended claims and equivalents thereof.

What is claimed is:

1. An ultra wide band signal generator, comprising:
   a tunable active inductor for generating harmonic signals having power strengths substantially equal to each other within a non-linear operating range, the tunable active inductor being capable of tuning a value thereof, comprising:
      a first transistor having a source connected to a voltage source and a gate connected to a first bias voltage;
      a second transistor having a drain connected to a drain of the first transistor and a gate connected to a second bias voltage;
      a third transistor having a drain connected to a source of the second transistor and a source connected to ground;
      a fourth transistor having a drain connected to a gate of the third transistor, a source connected to the ground, and a gate connected to a third bias voltage;
      a fifth transistor having a source connected to the drain of the fourth transistor and a drain connected to the voltage source; and
      a tunable feedback resistor interposed between the drain of the first transistor and a gate of the fifth transistor;
   an oscillator for amplifying and outputting the harmonic signals generated from the tunable active inductor by frequency-transiting the harmonic signals into high frequency bands; and
   a filter for selectively outputting one of the harmonic signals output from the oscillator.

2. The ultra wide band signal generator as claimed in claim 1, wherein the tunable feedback resistor further comprises:
   a first resistor interposed between the drain of the first transistor and the gate of the fifth transistor; and
   a sixth transistor having a drain connected to the drain of the first transistor, a source connected to the gate of the fifth transistor, and a gate connected to a fourth bias voltage.

3. The ultra wide band signal generator as claimed in claim 1, wherein the oscillator comprises:
   a seventh transistor having a base connected to the tunable active inductor;
   a first capacitor interposed between the tunable active inductor and the seventh transistor;
   a third resistor interposed between a fifth bias voltage and the base of the seventh transistor;
   a second capacitor interposed between the base of the seventh transistor and an emitter of the seventh transistor;
   a third capacitor interposed between ground and the second capacitor;
   a first current source interposed between the emitter of the seventh transistor and ground;
   a first inductor interposed between a voltage source and a collector of the seventh transistor; and
   a fourth capacitor interposed between the collector of the seventh transistor and an output port.

4. The ultra wide band signal generator as claimed in claim 3, wherein the filter performs filtering by using a first inductor and a first variable capacitor interposed between the collector of the seventh transistor and ground.

5. The ultra wide band signal generator as claimed in claim 1, wherein the oscillator comprises:
   an eighth transistor having a base interposed between the tunable active inductor and a sixth bias voltage;
   a fifth capacitor interposed between the tunable active inductor and the eighth transistor;
   a second variable capacitor interposed between the base of the eighth transistor and an emitter of the eighth transistor;
   a third variable capacitor interposed between the second variable capacitor and ground;
   a fourth resistor interposed between the emitter of the eighth transistor and ground;
   a second inductor interposed between the voltage source and the collector of the eighth transistor; and
   a sixth capacitor interposed between the collector of the eighth transistor and the output port.

6. The ultra wide band signal generator as claimed in claim 5, wherein the filter performs filtering by using a second inductor and a fourth variable capacitor interposed between the emitter of the eighth transistor and ground.

7. An ultra wide band signal generator, comprising:
   a tunable active inductor for generating harmonic signals having power strengths substantially equal to each other within a non-linear operating range, the tunable active inductor being capable of tuning a value thereof;
   a first transistor having a base connected to the tunable active inductor;
   a first resistor interposed between a first bias voltage and the base of the first transistor;
   a first capacitor interposed between the base and the emitter of the first transistor;
   a second capacitor interposed between the first capacitor and ground;
   a first current source interposed between the emitter of the first transistor and ground;
   a first inductor interposed between a voltage source and a collector of the first transistor;
   a third capacitor interposed between a collector of the first transistor and an output port; and
   a first variable capacitor interposed between a collector of the first transistor and ground.

8. The ultra wide band signal generator as claimed in claim 7, wherein the tunable active inductor comprises:
   a second transistor having a source connected to the voltage source and a gate connected to a second bias voltage;
   a third transistor having a drain connected to a drain of the second transistor and a gate connected to a third bias voltage;
   a fourth transistor having a drain connected to a source of the third transistor and a source connected to ground;
   a fifth transistor having a drain connected to a gate of the fourth transistor, a source connected to ground, and a gate connected to a fourth bias voltage;
   a sixth transistor having a source connected to the drain of the fifth transistor and a drain connected to the voltage source; and
   a first tunable resistance interposed between the drain of the second transistor and a gate of the sixth transistor.

9. The ultra wide band signal generator as claimed in claim 8, wherein the first tunable resistance comprises:
- a second resistor interposed between a drain of the second transistor and a gate of the sixth transistor; and
- a seventh transistor having a drain connected to the drain of the second transistor, a source connected to the gate of the sixth transistor, and a gate connected to a fifth bias voltage.

10. An ultra wide band signal generator, comprising:
- a tunable active inductor for generating harmonic signals having power strengths substantially equal to each other within a non-liner operation range, the tunable active inductor being capable of tuning a value thereof;
- a first transistor having a base connected to the tunable active inductor and a sixth bias voltage;
- a first capacitor interposed between the tunable active inductor and the first transistor;
- a first variable capacitor interposed between the base and an emitter of the first transistor;
- a second variable capacitor interposed between ground and the first variable capacitor;
- a first resistor interposed between the emitter of the first transistor and ground;
- a first inductor interposed between a voltage source and a collector of the first transistor;
- a second capacitor interposed between a collector of the first transistor and an output port; and
- a third variable capacitor interposed between a collector of the first transistor and ground.

11. The ultra wide band signal generator as claimed in claim 10, wherein the tunable active inductor comprises:
- a second transistor having a source connected to the voltage source and a gate connected to a first bias voltage;
- a third transistor having a drain connected to a drain of the second transistor and a gate connected to a second bias voltage;
- a fourth transistor having a drain connected to a source of the third transistor and a source connected to ground;
- a fifth transistor having a drain connected to the gate of the fourth transistor, a source connected to the grounding, and a gate connected to a third bias voltage;
- a sixth transistor having a source connected to the drain of the fifth transistor and a drain connected to the voltage source; and
- a first tunable resistance interposed between the drain of the second transistor and the gate of the sixth transistor.

12. The ultra wide band signal generator as claimed in claim 11, wherein the first tunable resistance comprises:
- a second resistor interposed between the drain of the second transistor and the gate of the sixth transistor; and
- a seventh transistor having a drain connected to the drain of the second transistor, a source connected to the gate of the sixth transistor, and a gate connected to a fourth bias voltage.

* * * * *